United States Patent [19]

Muraoka et al.

[11] Patent Number: 5,270,971
[45] Date of Patent: Dec. 14, 1993

[54] SEMICONDUCTOR MEMORY HAVING A PLURALITY OF SENSE AMPLIFIER CIRCUITS AND CORRESPONDING BIT LINES

[75] Inventors: Kazuyoshi Muraoka, Yokohama; Masaru Koyanagi, Tokyo; Minoru Yamada, Kawasaki, all of Japan

[73] Assignee: Kabushiki Kaisha Toshiba, Kawasaki, Japan

[21] Appl. No.: 677,442

[22] Filed: Mar. 29, 1991

[30] Foreign Application Priority Data

Mar. 29, 1990 [JP] Japan .................................. 2-82078

[51] Int. Cl.$^5$ .............................................. G11C 7/00
[52] U.S. Cl. .............................. 365/189.01; 365/205; 365/189.09
[58] Field of Search ................... 365/189.01, 203, 205, 365/207, 208, 189.09

[56] References Cited

U.S. PATENT DOCUMENTS

| | | | |
|---|---|---|---|
| 4,112,508 | 9/1978 | Itoh | 365/205 |
| 4,195,357 | 3/1980 | Kuo et al. | 365/210 |
| 4,242,739 | 12/1980 | Hori et al. | 365/203 |
| 4,608,670 | 8/1986 | Duvvury et al. | 365/205 |
| 4,627,033 | 12/1986 | Hyslop et al. | 365/205 |

OTHER PUBLICATIONS

Okamura et al., "Decoded-Source Sense Amplifier for High-Density DRAM's," IEEE Journal of Solid-State Circuits, vol. 25, No. 1, (Feb. 1990), pp. 18-22.

*Primary Examiner*—Joseph A. Popek
*Attorney, Agent, or Firm*—Foley & Lardner

[57] ABSTRACT

An improved semiconductor memory having a plurality of sense amplifier circuits corresponding to each bit line of a plurality of columns. A first common line is connected in common to the sense amplifier circuits, and a second common line is connected to the first common line. A first switching element is connected between the second common line and a reference voltage potential terminal, and a second switching element is connected to the first common line and the reference voltage potential. The second switching element corresponding to the first common line connected to one of the sense amplifier circuits is made conductive in response to a selection of the sense amplifier is disclosed.

3 Claims, 5 Drawing Sheets

SEMICONDUCTOR MEMORY HAVING A PLURALITY OF SENSE AMPLIFIER CIRCUITS AND CORRESPONDING BIT LINES

BACKGROUND OF THE INVENTION

This invention relates to a semiconductor memory device and, more particularly, to a memory device which comprises a sense amplifier circuit used to selectively reinforce the amplification capacity through column select lines which are designated by decoding column address signals.

In recent years, CMOS flip-flop sense amplifier circuits SA11 as shown in FIG. 4 were used as MOS type semiconductor memory devices. Each drain and gate of two N channel transistors are cross coupled and connected to bit line pair BL and $\overline{BL}$. Both sources are commonly connected at node $\overline{SAN}$ by way of the common source line S11. Furthermore, each drain and gate of two P channel transistors for restoring are cross coupled and connected to bit line pair BL and $\overline{BL}$. Both sources are commonly connected at node SAP. The bit line pair BL and $\overline{BL}$ are connected to the data input/output line pair DQ and $\overline{DQ}$ by way of the DQ gate 41, which is controlled by the column select signal supplied along the column select line CSL.

As shown in FIG. 5, a plurality of sense amplifier circuits SA11 are connected in series to the common source line S11 at the node $\overline{SAN}$ and connected to the reference voltage potential $V_{ss}$ terminal through a MOS transistor Qsan for activating the sense amplifier.

In all of the sense amplifier circuits with this type of construction, the transistor current, which lowers the potential of the bit lines to a low level, is discharged at the reference voltage potential terminal $V_{ss}$ along the source line S11. Here, there is the wiring resistance Rwir along the node $\overline{SAN}$ and parasitic resistance and capacitance in the activating MOS transistor Qsan.

The number of sense amplifier circuits SA1 tends to increase as the capacitance increases and the total discharge current from the bit lines increases. As a result, the amount of signals read from the input/output line pair DQ and $\overline{DQ}$ received from the sense amplifier circuits SA11 selected by the column select line CSL tends to reduce causing a decrease in the sense margin. The reason for such a tendency is that all of the columns are amplified by the same condition regardless of selection or non-selection caused by the fact.

In solving this problem, a circuit is proposed as shown in FIGS. 6 and 7, which selectively reinforces the capability of the sense amplifier through the column select line CSL (refer to 1989 Symposium on VSLI Circuits (Digest of Technical Papers)). Connected between the source line S12 of each of the sense amplifier circuits SA12 and the node $\overline{SAN}$ is normally a type N channel transistor Qn1 used as a resistance element to which the power supply voltage $V_{cc}$ is applied to the gate. Each source line S12 is connected to the reference voltage potential terminal $V_{ss}$ by way of the N channel transistor Qn2 which acts as a switching element. A column select signal is applied to the gate of each N channel transistor Qn2 and only transistors in the selected column are made conductive.

When the sense amplifier activating transistor Qsan conducts and the sense operation begins, the transistor current that lowers the potential of the bit lines to a low level is discharged at the reference voltage potential terminal $V_{ss}$ by way of the transistor Qn1, source line S12 and sense amplifier activating transistor Qsan. Only the transistors Qn2 connected to the selected column sense amplifier circuits SA12 conduct and bypass the sense amplifier circuit and reference voltage potential terminal $V_{ss}$. As a result, because only the parasitic capacitance in the selected bit lines is effected, amplification capability is reinforced.

However, due to the transistors Qn1 and Qn2, this kind of construction causes the chip area to be increased. Also, the column select line CSL, which controls the conduction state of the transistors Qn2, must be extended to run through the increased area. In a highly integrated semiconductor memory, when the lengths of both the column select line CSL and the common source node line $\overline{SAN}$ are increased, the coupling capacitance between the bit lines increases and causes a reduction in the sense margin.

Furthermore, increasing the length of the column select line CSL prevents speeding up the access time.

Still furthermore, because the source lines S12 are selectively connected to the power supply line $V_{ss}$ by the column select line CSL, each source line S12 must be electrically insulated. This becomes an obstacle in trying to increase integration because the distance between adjacent bit lines is not determined by the size of cell but is determined by the isolation of each of the sense amplifier circuits SA12 with respect to the others.

SUMMARY OF THE INVENTION

The object of this invention is to provide a semiconductor memory which, taking into consideration the above background art, has superior amplification capabilities while at the same time makes it possible to be highly integrated.

According to the present invention, there is provided a semiconductor memory comprising a plurality of sense amplifier circuits provided corresponding to each bit line of a plurality of columns, a first common line which is connected in common to the sense amplifier circuits, a second common line which is connected to the first common line, a first switching element which is connected between the second common line and a reference voltage potential terminal, and a second switching element which is connected to the first common line and the reference voltage potential, the second switching element corresponding to the first common line connected to one of the sense amplifier circuits being made conductive in response to selection of the sense amplifier.

The first common line connecting the sense amplifier circuit and the reference voltage potential is shared in common by a plurality of columns. Because only one first common line is enough for several columns, it very easy to wire the first common line. Also a second switching element can be connected to each of the several columns as if they were a single unit. When isolating the elements of the field of each sense amplifier circuit, it is sufficient to take the sense amplifier circuits of the multiple columns all together and make one isolated element field for each group. Accordingly, the area of the element isolation field can be reduced, making it possible to reduce the entire area of the chip. By making it simpler to wire the first common line, the coupling capacitance between the first common line and the bit lines is reduced and the sense margin is increased. Also, because it is easier to wire the first common line, the length of the line which controls the conductive state and non-conductive state of the second switching element can be shortened. As a result, the coupling capacitance between the bit lines and the control line of the second switching element, which has been a problem for a highly integrated semiconductor memory, is reduced. This increases the sense margin as well as reduces the line resistance and line capacitance of the second switching element control line making it possible to improve access time.

BRIEF DESCRIPTION OF THE DRAWINGS

In the accompanying drawings.

DESCRIPTION OF THE PREFERRED EMBODIMENT

Figure 1:
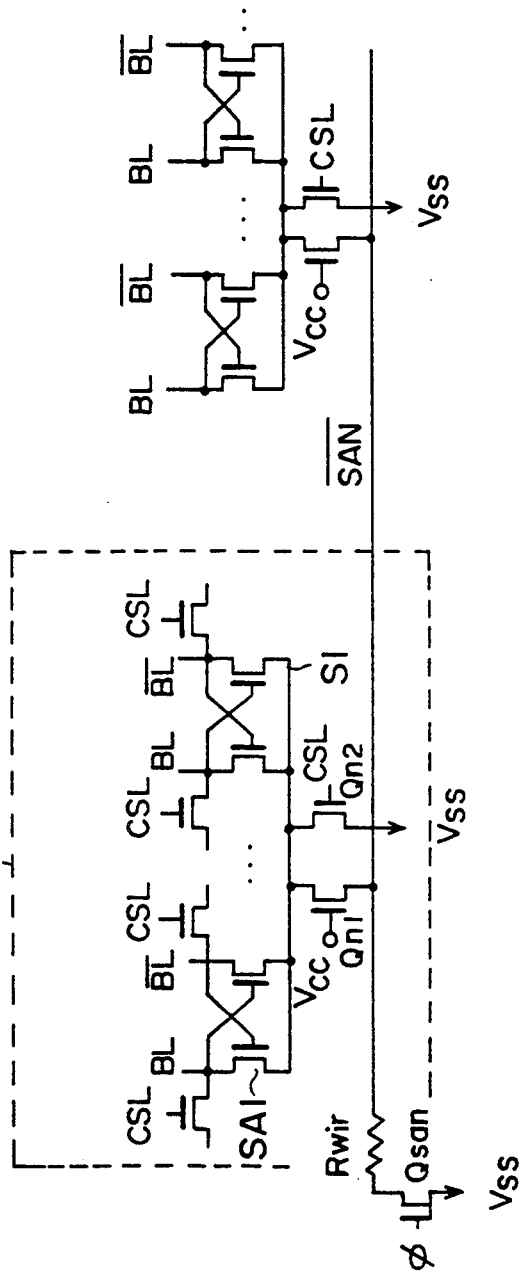
FIG. 1 is a circuit diagram showing the construction of one embodiment of the semiconductor memory of this invention.
Figure 6:
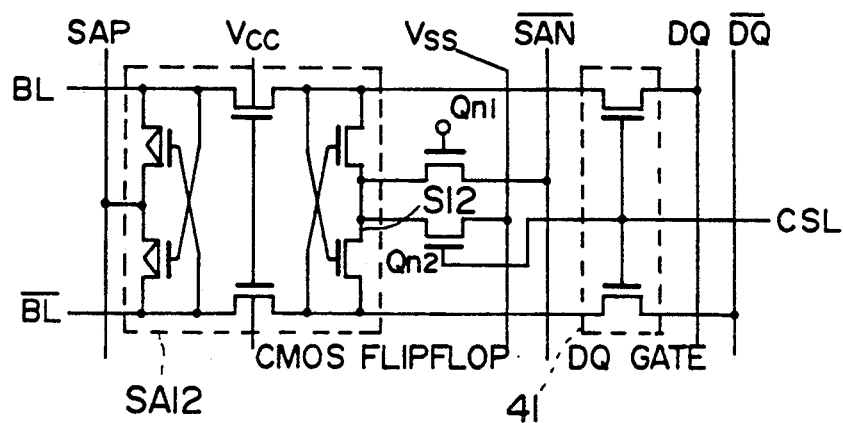
FIG. 6 is a circuit diagram showing the construction of another conventional semiconductor memory.
Figure 7:
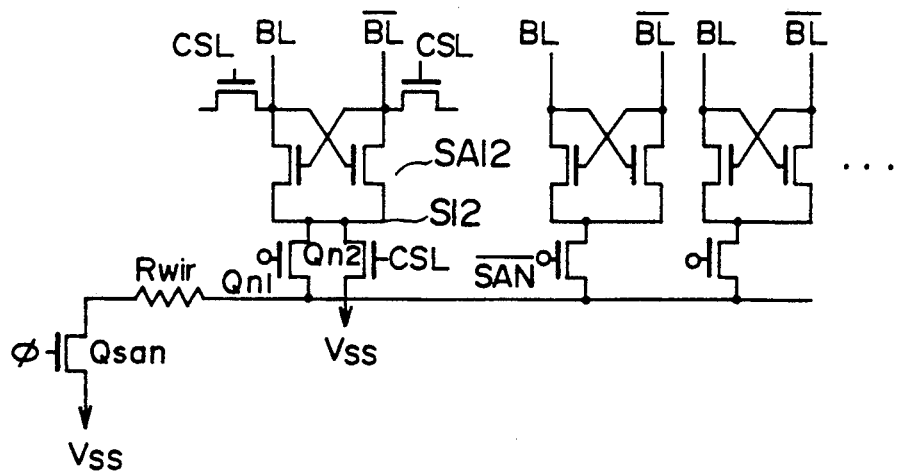
FIG. 7 is a circuit diagram showing the arrangement of the multiple sense amplifier circuits of the same memory.

One embodiment of this invention is now explained with reference of the drawings. In this embodiment each of the sense amplifier source lines of the sense amplifier circuits are connected to the node SAN as shown in FIG. 1. In comparing it with the conventional memory as shown in FIG. 7, it has the characteristic that each of a plurality of columns 10 has in common a source line S1. In doing so, one pair of transistors Qn1 and Qn2 are sufficient for each of the multiple columns 10. The other elements of construction and circuit operation are the same as that of the conventional memory as shown in FIGS. 6 and 7 and so the explanation of them will be omitted.

Figure 2:
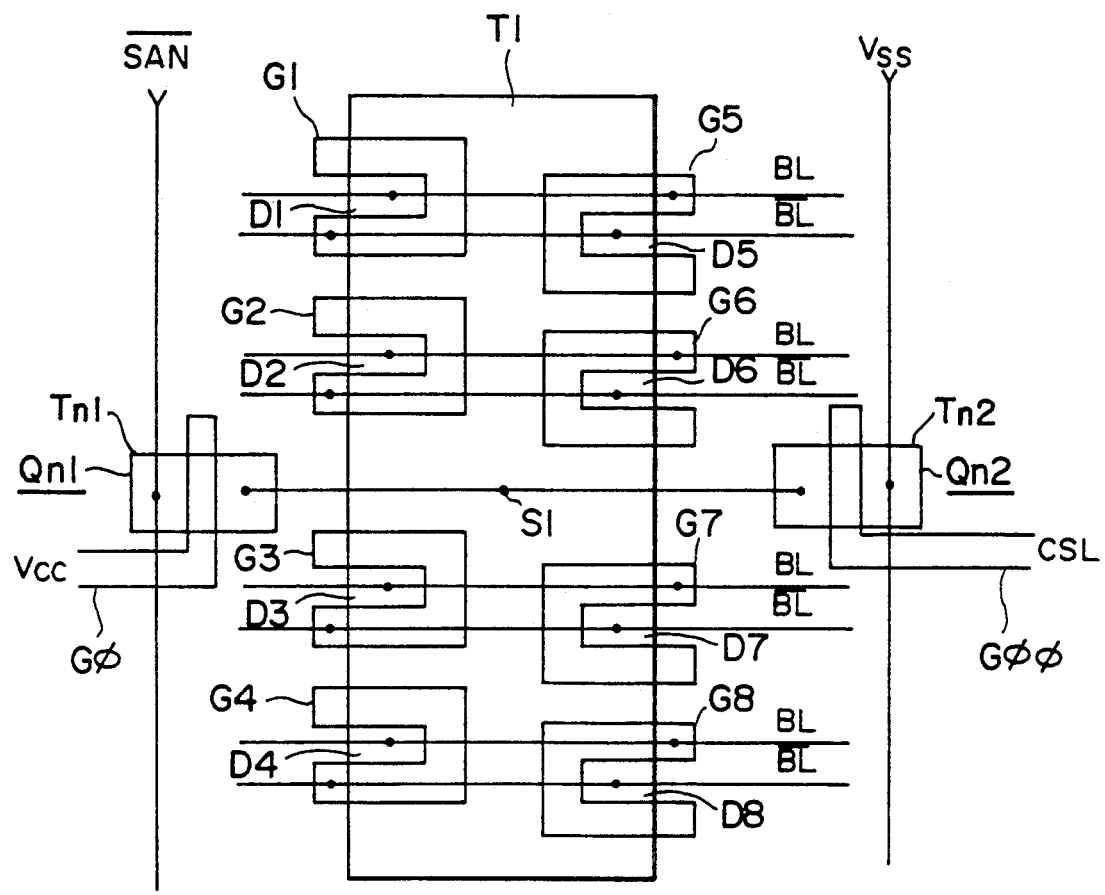
FIG. 2 is a diagram showing the arrangement pattern of the same memory.

The pattern arrangement of the sense amplifier circuit SA1 and the transistors Qn1 and Qn2 on the semiconductor substrate is shown in FIG. 2. All of the elements of the sense amplifier circuits SA1 of 4 columns are taken as a single unit and arranged in the transistor field T1. The four pairs of N channel transistors, for example the drain region D1 and the gate electrode G5, the drain region D5 and the gate electrode G1, are cross coupled and connected to the bit line pairs BL and $\overline{BL}$. For convenience, the connections of the bit lines with each diffused layer are shown as black dots. The transistor Qn1 is in the transistor field Tn1 and the power supply voltage $V_{cc}$ is applied to the gate electrode G$\phi$. The transistor Qn2 is in transistor field Tn2 and the column select line CSL is connected to the gate electrode G$\phi\phi$.

In this way, the four columns taken as a single unit have in common the source line S1 and the following results can be obtained. First, because one source line S1 is sufficient for the four columns it is simple to wire the line. Also one pair of transistors Qn1 and Qn2 are sufficient for each four column group. Between each of the sense amplifier circuits SA1 there only need be one element isolation field formed for each four column group. In so doing, it becomes possible to reduce the chip area comparing to conventional circuits.

The length of the column select line CSL connected to the gate of the transistor Qn2 can be shortened because it is simpler to wire the source line S1. This makes it possible to reduce the coupling capacitance between the column select line CSL and the bit line pair BL and $\overline{BL}$, which is a problem in highly integrated semiconductor memory, and increases the sense margin. Also, because both the line resistance and line capacitance in the column select line CSL are reduced, it is possible to reduce the access time.

In the above embodiment, the sense amplifier circuits SA1 of four columns are taken as a single unit and have a common source line S1, however, it is also possible to have multiple columns besides four, for example it is possible to select eight, which is a multiple of 2.

Figure 3:
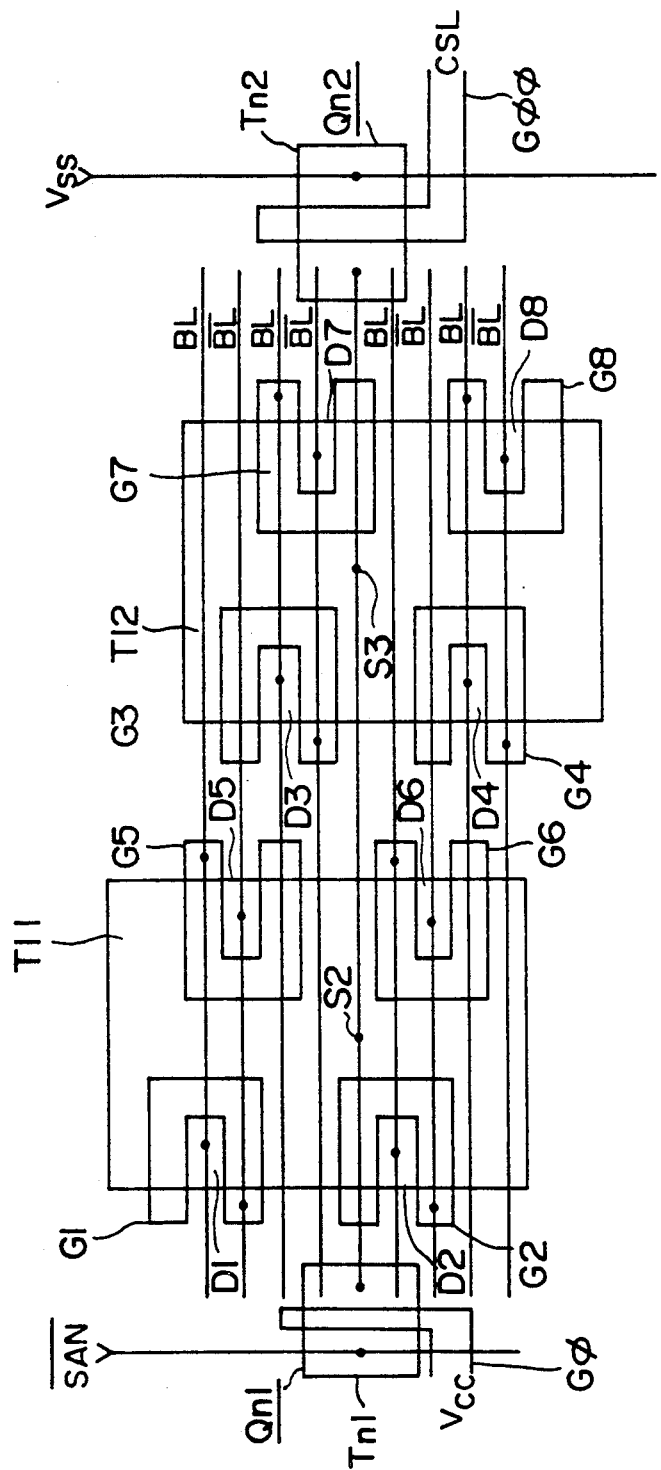
FIG. 3 is a diagram showing the arrangement pattern of another embodiment of the semiconductor memory of this invention.
Figure 4:
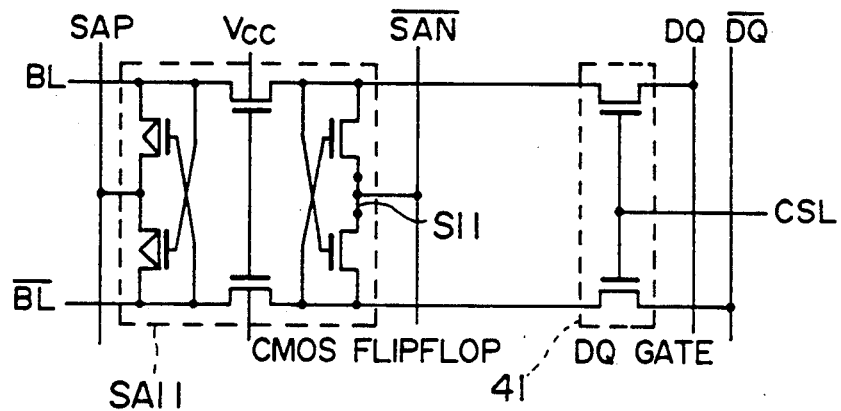
FIG. 4 is a circuit diagram showing the construction of a conventional semiconductor memory.
Figure 5:
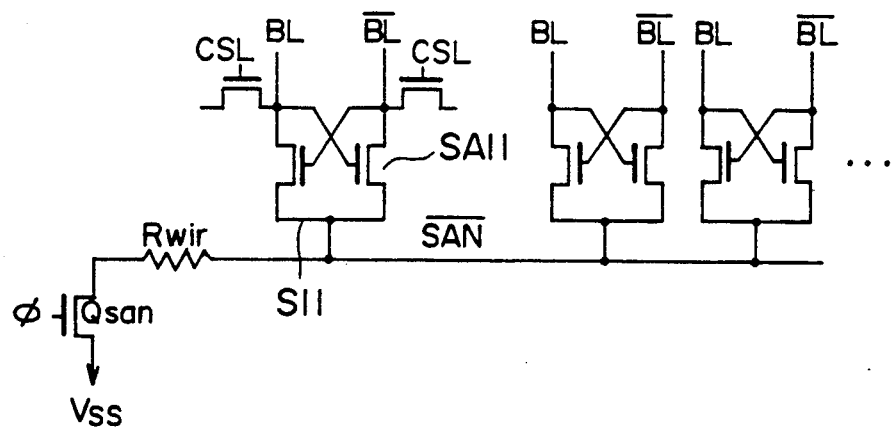
FIG. 5 is a circuit diagram showing the arrangement of the multiple sense amplifier circuits of the same memory.

In the circuit pattern arrangement shown in FIG. 3, the two column sense amplifier circuits SA1 have the source line S2 or S3 in common and the transistor field is divided into T11 and T12 with each having a pair of N channel transistors. In this case, every two columns are isolated and arranged horizontally making it possible to prevent an increase in chip area in the vertical direction.

What is claimed is:

1. A semiconductor memory comprising:
   a plurality of circuit blocks, each circuit block having a plurality of sense amplifiers corresponding, respectively, with a plurality of memory columns, a first common line to which the sources of said sense amplifiers are connected, a first switching element connected between said first common line and a reference potential terminal, said first common line and said first switching element being provided in common to said plurality of sense amplifiers;
   a second common line connected to said first common line, and
   a second switching element connected between said second common line and said reference potential terminal, said second common line and said second switching element being provided in common to said plurality of circuit blocks.

2. The semiconductor memory according to claim 4, wherein the reference voltage potential is ground level and said first switching element is a transistor that conducts according to a clock signal.

3. The semiconductor memory according to claim 2, wherein said second switching element is a transistor that conducts according to a column select signal.

* * * * *